(12) United States Patent
Li et al.

(10) Patent No.: US 9,998,085 B2
(45) Date of Patent: Jun. 12, 2018

(54) WAVEGUIDE

(71) Applicant: Oxford University Innovation Limited, Oxford (GB)

(72) Inventors: Yue Li, Oxford (GB); Christopher John Stevens, Oxford (GB); Christopher Wing Tai Chan, Oxford (GB)

(73) Assignee: Oxford University Innovation Limited, Oxford (GB)

( * ) Notice: Subject to any disclaimer, the term of this patent is extended or adjusted under 35 U.S.C. 154(b) by 5 days.

(21) Appl. No.: 14/915,357

(22) PCT Filed: Sep. 9, 2014

(86) PCT No.: PCT/GB2014/052716
§ 371 (c)(1),
(2) Date: Feb. 29, 2016

(87) PCT Pub. No.: WO2015/033168
PCT Pub. Date: Mar. 12, 2015

(65) Prior Publication Data
US 2016/0218689 A1    Jul. 28, 2016

(30) Foreign Application Priority Data
Sep. 9, 2013  (GB) .................................. 1316011.4

(51) Int. Cl.
*H01P 1/20*     (2006.01)
*H03H 7/00*    (2006.01)
(Continued)

(52) U.S. Cl.
CPC ......... *H03H 7/004* (2013.01); *H01P 1/20381* (2013.01); *H04B 5/0012* (2013.01); *H04B 5/0031* (2013.01); *H04B 5/0075* (2013.01)

(58) Field of Classification Search
CPC .................................. H01P 1/201; H01P 1/213
(Continued)

(56) References Cited

U.S. PATENT DOCUMENTS 6,175,727 B1 *  1/2001  Mostov ............... H01F 17/0006
                                                            174/255
7,102,469 B2 *  9/2006  Kim .................... H01P 1/20381
                                                            333/202
(Continued)

FOREIGN PATENT DOCUMENTS

EP         1564835         8/2005
WO     WO-2009/067197      5/2009
(Continued)

OTHER PUBLICATIONS

Caloz, Christophe, "Perspectives on EM metamaterials," Materials Today, vol. 12, No. 3 pp. 12-20 (Mar. 2009).
(Continued)

*Primary Examiner* — Dean Takaoka
(74) *Attorney, Agent, or Firm* — Wilmer Cutler Pickering Hale and Dorr LLP

(57) ABSTRACT

Waveguide A waveguide for carrying waves by inductive coupling comprises a plurality of resonant elements, the plurality of resonant elements including a first resonant element; a second resonant element; and a coupling section capacitively coupling the first and second resonant elements, wherein the coupling between the first and second elements produces a first pass-band and a second-pass band, different from the first pass-band, the first pass-band being associated with the resonance of the resonant elements and the second pass-band being associated with resonance of the coupling section.

13 Claims, 8 Drawing Sheets

(51) Int. Cl.
*H01P 1/203* (2006.01)
*H04B 5/00* (2006.01)
*H01P 7/00* (2006.01)

(58) Field of Classification Search
USPC .................................................. 333/202, 175
See application file for complete search history.

(56) References Cited

U.S. PATENT DOCUMENTS

| | | | | |
|---|---|---|---|---|
| 7,116,186 B2 * | 10/2006 | Chen | .................... | H04B 1/0067 |
| | | | | 333/126 |
| 7,272,367 B2 * | 9/2007 | Amano | .................... | H03H 7/09 |
| | | | | 333/132 |
| 7,642,781 B2 * | 1/2010 | Ballon | ............. | G01R 33/34046 |
| | | | | 324/318 |
| 7,667,557 B2 * | 2/2010 | Chen | ........................ | H03H 1/00 |
| | | | | 333/175 |
| 8,237,519 B2 * | 8/2012 | Achour | .................... | H01P 1/203 |
| | | | | 333/172 |
| 8,680,952 B2 * | 3/2014 | Erb | .................... | H01P 1/20345 |
| | | | | 333/204 |
| 9,196,941 B2 * | 11/2015 | Chuang | ............... | H01P 1/20345 |
| 2006/0046682 A1 | 3/2006 | Chen | | |
| 2014/0327497 A1 * | 11/2014 | Gorbachov | ............. | H03H 7/09 |
| | | | | 333/168 |

FOREIGN PATENT DOCUMENTS

WO  WO-2012/004818  1/2012
WO  WO-2012/172371  12/2012

OTHER PUBLICATIONS

International Preliminary Report on Patentability issued by the European Patent Office as International Searching Authority for International Application No. PCT/GB2014/052716 dated Mar. 15, 2016 (5 pages).

International Search Report and Written Opinion issued by the European Patent Office as International Searching Authority for International Application No. PCT/GB2014/052716 dated Dec. 8, 2014 (10 pages).

Rohde, U. L. and Poddar, A. K., "Miniaturized VCOs arm configurable synthesizers," Sarnoff Symposium, Sarnoff '09, IEEE, pp. 1-6 (Mar. 30-Apr. 1, 2009).

Search Report issued by the UK Patent Office for Application No. GB1316011.4 dated Feb. 24, 2014 (3 pages).

Solymar, L. and Shamonina, E., "Waves in Metamaterials," Oxford University Press, 420 pages (2009).

* cited by examiner

WAVEGUIDE

CROSS-REFERENCE TO RELATED APPLICATIONS

This application is a 35 U.S.C. 371 National Stage of International Patent Application No. PCT/GB2014/052716, filed Sep. 9, 2014, which designated the U.S. and which claims priority to and the benefit of GB 1316011.4, filed Sep. 9, 2013.

This invention relates to waveguides for carrying waves by inductive coupling, a system including the waveguide, and a method of transporting a signal in waveguide by inductive coupling.

BACKGROUND

Power and data connections between electronic devices are typically made by means of cables, and data connections may be made by wireless radio communications devices. Computing devices typically connect with associated accessories and peripherals such as printers, digital cameras, external hard drives and flash drives by Universal Serial Bus (USB) or similar cable interfaces. Microprocessors are generally connected to associated components via multiconductor bus lines defined as tracks on a printed circuit board (PCB) or similar.

A problem associated with cable connections is that they present a trip hazard as well as a potential electrical shock hazard. Thus, cable management systems are typically required. Such systems are particularly important in the workplace and public access areas where health and safety legislation must be complied with. Cable connections are also potentially clumsy and require manual manipulation of a connector fitted to the cable in order to effect a connection. This can be a problem for physically challenged individuals. Repeated connection and disconnection limits the lifespan of connectors due to wear.

In most cases, wireless connections are not suitable for providing power to a device.

BRIEF SUMMARY OF THE DISCLOSURE

In accordance with embodiments of the present invention there is provided a waveguide for carrying waves by inductive coupling, a system including the waveguide, and a method of transporting a signal in waveguide by inductive coupling.

An aspect of the invention provides a waveguide for carrying waves by inductive coupling, the waveguide comprising a plurality of resonant elements, the plurality of resonant elements including a first resonant element; a second resonant element; and a coupling section capacitively coupling the first and second resonant elements, wherein the coupling between the first and second elements produces a first pass-band and a second-pass band, different from the first pass-band, the first pass-band being associated with the resonance of the resonant elements and the second pass-band being associated with resonance of the coupling section.

The first resonant element may form a first major loop and the second resonant element may form a second major loop, and the coupling section may form a minor loop such that respective portions of each of the first and second major loops is shared with the minor loop. Each of the shared portions may include a capacitor.

The waves may be forward propagating.

The waveguide of any preceding claim, wherein an electrical contribution to the coupling between the first and second resonant elements dominates a magnetic contribution to the coupling between the first and second resonant elements.

The first resonant element may have the same frequency as the second resonant element, and the coupling section may resonate with a resonant frequency different from the resonant frequency of the first and second resonant element.

The coupling section may comprise one or more coupling capacitors connected between the first and second resonant elements.

The waveguide may comprise a one-dimensional array of coupling sections, each consecutive pair of resonant elements having a respective coupling element capacitively coupling the pair of resonant elements.

The waveguide may comprise a two-dimensional array of coupling sections, each pair of neighbouring resonant elements having a respective coupling element capacitively coupling the pair of resonant elements.

An aspect of the invention provides a system comprising: the waveguide; and a communication unit, wherein the communication unit comprises: an IO resonant element that is arranged to transmit and/or receive a signal to/from the first resonant element by inductively coupling to the first resonant element, and a signal source and/or destination conductively connected to the IO resonant element.

An aspect of the invention provides a method of transporting a signal in a waveguide by inductive coupling, the method comprising: receiving the signal at a first resonant element of a coupling section; and propagating the signal to a second resonant element, wherein the first and second resonant elements are capacitively coupled by the coupling section, and the coupling between the first and second elements produces a first pass-band and a second-pass band, different from the first pass-band, the first pass-band being associated with the resonance of the resonant elements and the second pass-band being associated with resonance of the coupling section.

The signal may be received by the first resonant element or the coupling section from an element external to the waveguide. The signal may be received by the first resonant element or the coupling section from a further resonant element or further coupling section of the waveguide.

BRIEF DESCRIPTION OF THE DRAWINGS

Embodiments of the invention are further described hereinafter with reference to the accompanying drawings, in which.

DETAILED DESCRIPTION

Figure 1A:
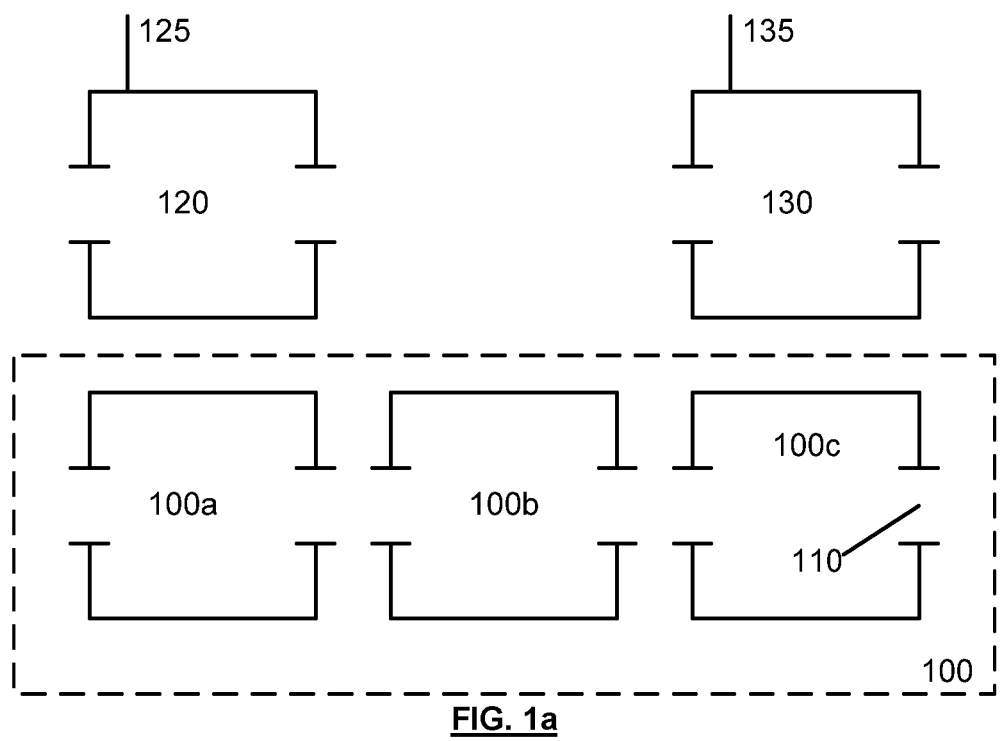
FIG. 1a shows a waveguide that supports only magnetoinductive waves (a pure magnetoinductive waveguide).

FIG. 1a shows an example of a one-dimensional magneto-inductive waveguide 100. The waveguide includes a row of resonators 100a-100c. In some examples, the resonators 100a-100c are LCR circuits. The resonators have substantially the same resonant frequency. In the example of FIG. 1a, each resonator is a loop having one or more capacitive gaps 110. The resistance of the loop and self-inductance of the loop provide the resistance and inductance of the LCR circuit, while a capacitor 110 across a gap in the loop provides the capacitance. The resonators 100a-100c are inductively linked, such that a signal provided to one of the resonators, e.g. 100a, will be propagated as a magnetoinductive wave along the line of resonators (e.g. to 100c via 100b). The resonators may couple to resonators of external devices, such as a transmitter and/or receiver by a similar inductive process. For example, a signal may be introduced to resonator 100a by a transmit resonator 120 that is inductively coupled with resonator 100a of the waveguide. The signal may be introduced to resonator 120 via a wire connection, 125. The signal will be carried along the waveguide 100 by magnetoinductive waves to resonator 100c. Resonator 100c is inductively coupled with receive resonator 130, such that receive resonator 130 receives the signal propagated along the waveguide 100. The signal received by receive resonator 130 may be output via a conductive connection 135. Transmit 120 and receive 130 resonators may have the same resonant frequency as the resonators 100a-100c of the waveguide 100. FIG. 1a shows the transmit 120 and receive 130 resonators having similar structure to the resonators 100a-100c of the waveguide 100 to produce strong coupling and good signal transfer. However, the transmit 120 and receive 130 resonators may have a different structure from the resonators 100a-100c of the waveguide 100.

For clarity, FIG. 1a shows the transmit 120 and receive 130 resonators next to the waveguide 100, such that the planes of the transmit/receive resonator 120, 130 is in the same plane as the resonant element 100a-100c of the waveguide 100 to which it couples. However, stronger coupling between the transmit/receive resonator 120, 130 and the waveguide 100 can be achieved by positioning the transmit/receive resonator 120, 130 such that the plane of the transmit/receive resonator 120, 130 is parallel to and above or below the plane of the resonator 100a-100c in the waveguide 100 to which it couples, with the loop of the transmit/receive resonator 120, 130 and the loop of the resonant element 100a-100c of the waveguide 100 close or overlapping when viewed along the axis of the resonant element 100a-100c. The greater the mutual flux of the transmit/receive resonator 120, 130 and the resonant element 100a-100c that is couples to, the greater the coupling strength.

The signal may carry data and/or power between the transmit resonator 120 and the receive resonator 130. The transmit 120 and/or receive 130 resonators are not necessarily external devices, and may be part of the waveguide 100.

The arrangement of FIG. 1a allows signals to be carried between the transmit 120 and receive 130 resonators without requiring physical coupling between connectors, such as via a plug and socket. Furthermore, the connection between the transmit/receive resonators 120, 130 and the waveguide 100 can be made at any point along the length of the waveguide 100. In contrast, connection with a typical conductive cable is possible only at an end, where a connector is provided.

Figure 1B:
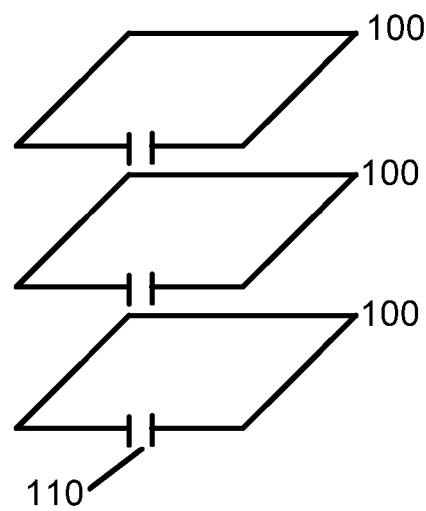
FIG. 1b shows another example of a pure magnetoinductive waveguide.

In the arrangement of FIG. 1, coupling between neighboring resonant elements depends on the mutual flux, which in turn depends on the geometry and spacing of the elements, and is limited by the spatial proximity that can be achieved in practice. The largest demonstrated coupling strengths in MIW devices have been in devices having an axially coupled structure, in which the resonant elements are arranged with the loops stacked along an axis, as shown in FIG. 1b. However, transmit and receive resonators can only be strongly coupled to the arrangement of FIG. 1b at the ends of the stack of resonant elements, limiting the applicability of this arrangement to cases requiring flexibility with regard to the coupling location of transmit and receive resonators.

Figure 2:
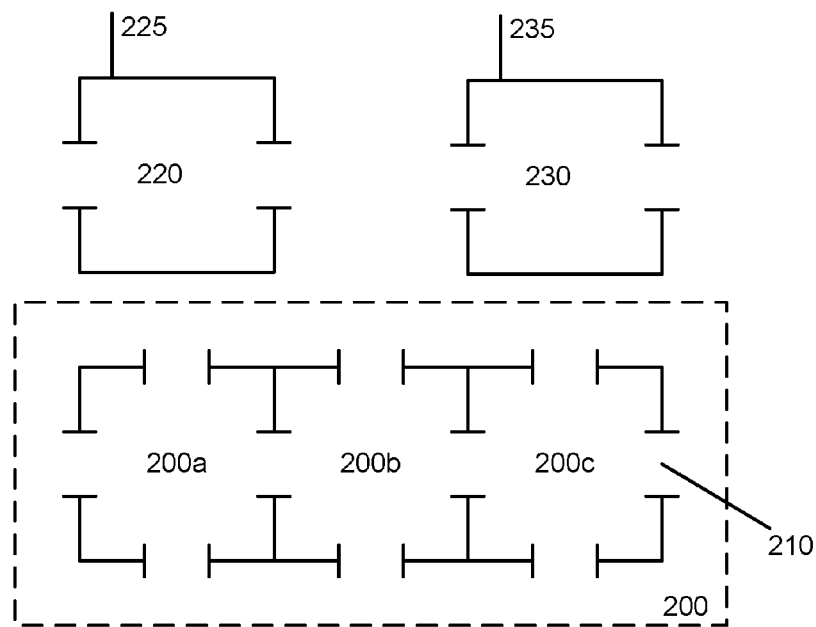
FIG. 2 shows another example of a pure magnetoinductive waveguide.

FIG. 2 shows another example of a magnetoinductive waveguide. In the example of FIG. 2, the resonant elements 200a-200c have common portions, e.g. shared sides. The resonant elements of FIG. 2 have a similar structure to those of FIG. 1a, and each includes at least two capacitive gaps 110. Each resonant element has, except at an end, at least two shared portions that are shared with respective neighboring resonant elements (i.e. the portions form part of two resonant elements). A capacitor is provided on each shared portion. Signals can be introduced to and received from the magnetoinductive waveguide of FIG. 2 using transmit 220 and receive 230 resonators in a similar manner to the arrangement of FIG. 1a.

Figure 3:
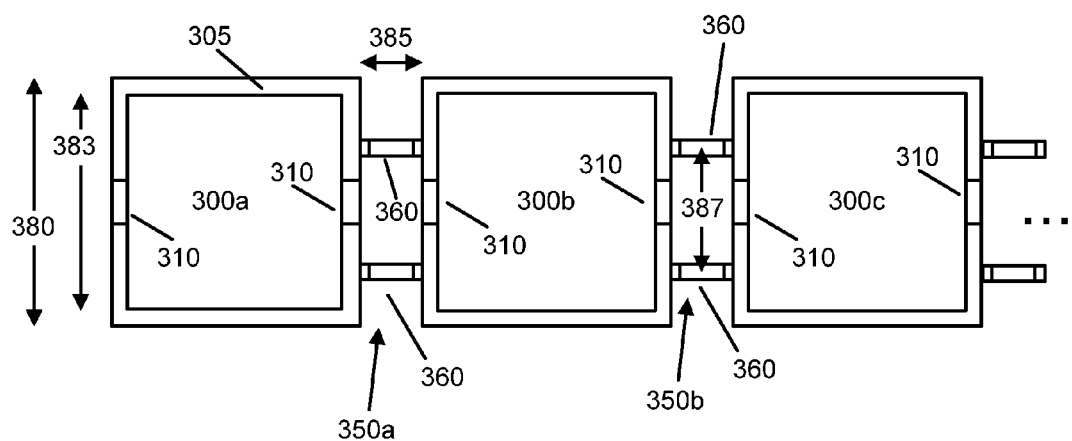
FIG. 3 shows an embodiment of a one-dimensional waveguide having resonant elements and coupling sections.

FIG. 3 shows an embodiment of a waveguide for carrying metamaterial waves. Metamaterial waves are described in the book "Waves in Metamaterials", Shamonia and Solymar, (2009, ISBN: 0199215332). Metamaterial waves may be electroinductive waves (EIW) or magnetoinductive waves (MIW), or a combination.

The embodiment of FIG. 3 has a first resonant element 300a and second resonant element 300b. The first 300a and second 300b resonant elements may have the same, or essentially the same, resonant frequency. The first 300a and second 300b resonant elements may be LCR circuits, similar to those of FIGS. 1a and 2 and may include two or more resonance capacitors 310. In some examples the resonance capacitors 310 are formed by a gap in the conductive loop of the resonator 300a, 300b, such that the plates of the capacitor are defined by the conductor forming the loop and the dielectric of the capacitor 310 is air and/or a substrate supporting the conductive loop. In some embodiments the resonance capacitor is a component, such as a ceramic capacitor, electrolytic capacitor, film capacitor, etc. In some cases a capacitor may be connected across the gap in the loop by soldering the capacitor to the conductive loop either side of the gap.

The first 300a and second 300b resonant elements are coupled by a coupling section 350a. In the example of FIG. 3, the coupling section 350a includes a pair of coupling capacitors 360. Each of the coupling capacitors 360 have a terminal connected to the first resonator 300a and a terminal connected to the second resonator 300b.

FIG. 3 shows a third resonant element 300c coupled to the second resonant element 300b by a second coupling section 350b. Further resonant elements 300 and coupling sections 360 may be provided in a similar manner, resulting in a longer waveguide.

In some embodiments a coupling section is provided between each pair of neighboring resonant elements. Thus, for a linear array of N resonant elements, there would be N−1 coupling sections.

The loops of FIG. 3 may be produced by forming conductive traces 305 on a substrate and connecting capacitors, e.g. by soldering, across gaps in the conductive traces 305 to act as the resonance capacitors 310. The coupling capacitors 360 may be connected between resonance elements by soldering the capacitors to the conductive loops of respective resonant elements, for example. Such a structure is easy to produce with existing fabrication technology. Other structures could alternatively be used: for example, the conductors may be free-standing or wrapped around insulating formers instead of being formed on a substrate.

The coupling section 350a results in electric coupling between the first 300a and second 300b resonant elements.

In the example of FIG. 3, the coupling section 350 forms a resonant element. Relative to the first 300a and second 300b resonant elements, the coupling section 350 may have different values of self-inductance, capacitance and/or resistance. The coupling section 350 may have a different resonant frequency from the first and second resonant elements 300a, 300b.

In the embodiment of FIG. 3, the resonant elements 300a-300c may be viewed as main loops, and the coupling sections 350 may be viewed as minor loops, with the resonance capacitors 310 shared between, or forming part of, both of a major loop and a neighboring minor loop. The coupling capacitors 360 form part of the minor loop, but are not shared with the major loop. In the following description, resonant elements 300a-300c may be referred to as major loops and coupling sections 350a, 350b may be referred to as minor loops. The use of these terms does not preclude more general shape, form or structure of the resonant elements 300a-300c and coupling sections 350a, 350b.

The arrangement of FIG. 3, when extended with more major and minor loops, has a periodic structure with two different types of element in each period: a resonant element 300 and a coupling section 350. In the example of FIG. 3 there is one of each type of element in each period. Both of these types of element are resonant, and each has a pass-band associated with its respective resonance. As described in more detail later, the pass-bands are different, even when the resonant elements 300 have the same resonant frequency as the coupling sections 350.

Herein, references to neighboring refer to a next element of a particular type along the waveguide. Thus, coupling sections 350a and 350b are both neighboring coupling sections to resonant element 300b. Similarly, resonant elements 300a and 300c are both neighboring resonant elements to resonant element 300b. The presence of coupling section 350a between resonant elements 300a and 300b does not prevent these resonant elements being considered neighboring resonant elements. However, resonant elements 300a and 300c are not neighboring resonant elements, as there is an element of the same type (i.e. resonant element 300b) between them. In two-dimensional embodiments, neighboring elements may be provided in two directions. For example, in a square or rectangular grid arrangement, there may be a respective neighboring element along each of the two orthogonal directions perpendicular to the sides of the square/rectangular loops.

In FIG. 3 the outer width 380 and inner width 383 of the resonant elements 300 are related to the thickness of the conductive elements (e.g. conductive traces 305) forming the loop of the resonant element 300. The inter-element distance 385 represents the separation between neighboring resonant elements 300. The coupling section width 387 represents the distance between the coupling capacitors 360 of the coupling section 350. These measurement parameters are suitable for an arrangement having the geometry shown in FIG. 3, the substrate and conductive loops of which may be fabricated as a printed circuit board, with capacitors soldered between gaps in and between the conductive loops, for example. In other structures, with different fabrication methods and/or geometries, etc. other measurements may be more appropriate.

For simplicity, many of the examples and embodiments herein are based on square resonant elements, but the shape of the resonant elements is not particularly limited, and some embodiments may have resonant elements of other shapes, such as rectangular, triangular, hexagonal, etc. Some embodiments may make use of resonant elements that are not regular polygons (such as rhomboids or isosceles triangles), and some embodiments include resonant elements that are not polygonal (e.g. shapes having non-linear portions, spirals, etc.) or are concave polygons. Here, description of the shape of loops of resonant elements (e.g. as square, rectangular, etc.) overlooks breaks or gaps in the conductive loop in which a capacitor is to be provided.

As described in more detail below, experimental and theoretical investigation has shown that the arrangement of FIG. 3 supports metamaterial waves, useable for carrying data or power. Depending on the construction and parameters of the device, the metamaterial waves may have a one or both of a magnetoinductive or electrodinductive character, and so this embodiment permits waves to be supported based on a different physical process from the process that supports magnetoinductive waves in the arrangements of FIGS. 1 and 2. This is a result of the capacitive coupling between the resonant elements 300 that results from the use of the (capacitive) coupling section 350. The capacitive coupling due to the coupling section 350 and can be controlled in a simple manner by appropriate selection of the capacitance of the coupling capacitors 360. As explained below, some embodiments provide a significant increase in bandwidth when compared with the arrangements of FIGS. 1 and 2, approaching the bandwidth limit for an ultra-wideband channel.

As with the arrangement of FIG. 1, a connection with a transmit/receive resonator may be made at any point of the waveguide of FIG. 3. In particular, coupling with an external resonator may be via a coupling element 300 or a coupling section 350.

Figure 4A:
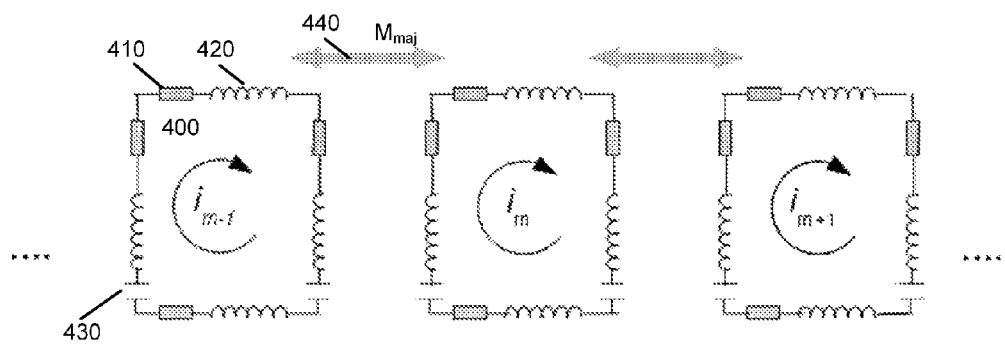
FIG. 4a shows a circuit model of the waveguide of FIG. 1.

FIG. 4a shows a circuit model of the arrangement of FIG. 1a. Each side of the resonant element 100a-100c can be considered to correspond to a resistor 410 and an inductor 420. In addition, for each side of the resonant element in FIG. 1a having a capacitor 110, the equivalent side in the circuit model has a corresponding capacitance 430.

The sides of the resonant element 100a-100c that include a capacitor 110 also include corresponding capacitors 430. The inductors 420 represent contributions to the self-inductance of the resonant element 100a-100c. The magnetic coupling, $M_{maj}$, between neighboring resonant elements 400 is shown by arrow 440. In some embodiments there may be coupling between next-nearest neighbors or further neighbors, but for simplicity this is not considered in the following discussion.

The arrow $i_m$ represents the current in the mth resonator. The direction of the arrow indicates the direction for current to be considered positive (clockwise in FIG. 4a). Current flowing in the opposite direction (anticlockwise) is considered to be negative.

Figure 4B:
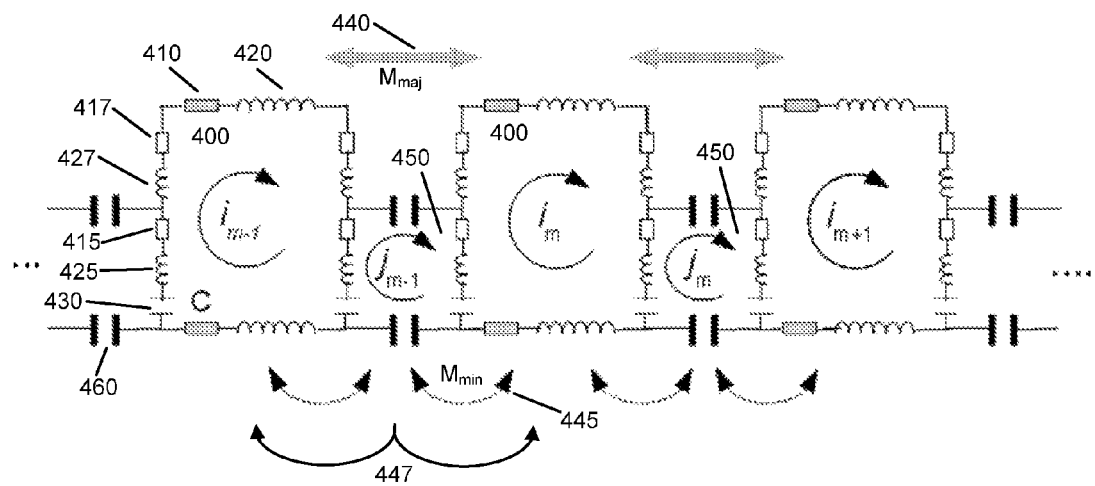
FIG. 4b shows a circuit model of the waveguide of FIG. 3.

FIG. 4b shows a circuit model for the arrangement of FIG. 3. Resistors 410, inductors 420 and resonance capacitors 430 are similar to those of FIG. 4a. The circuit model distinguishes portions of the major loop that are shared with the minor loop from those portions that are not. Accordingly, each side of a major loop that is shared with a minor loop includes first 417 and second 415 resistors that respectively relate to the resistance of an unshared portion of the side of the major loop and the resistance of a shared portion of the side of the major loop. Similarly, first 427 and second 425 inductors correspond, respectively, to the contribution to the self-inductance of the loop due to unshared and shared portions of the side of the loop.

For simplicity, the following discussion assumes that the coupling section width 387 is half of the outer width 380, such that the inductance of inductor 425 is the same as the inductance of inductor 427, and the resistance of resistor 415 is the same as the resistance of resistor 417. However, this is not required, and these inductances 425, 427 and resistances 415, 417 may be different in some embodiments.

FIG. 4b shows the magnetic coupling $M_{maj}$ between neighboring major loops 400 as arrow 440. This corresponds with $M_{maj}$, as illustrated in FIG. 4a. The arrow $M_{min}$ 445 describes mutual inductance between a major loop 400 and a neighboring minor loop 450. This coupling is not present in the arrangement of FIG. 4a. Arrow 447 represents electric coupling between neighboring major loops 400 due to the capacitive coupling via the minor loop 450. This form of coupling is not present in the arrangement of FIG. 4a. Moreover, this coupling is mainly controlled by the capacitance values of the coupling capacitors 460, and may also be relevant to the geometry/sizes or spacing/location of the resonant elements. The electric coupling may be enhanced by increasing the coupling capacitance, and/or by decreasing the lengths of the shared portions (decreasing the self-inductance of the minor loop).

As with FIG. 4a, arrows $i_m$ in FIG. 4b represent current flow in the mth major loop 400, and the direction of the arrow shows the direction of positive current flow. Current in the loop of the mth minor loop 450 is shown by arrow $j_m$, with direction of positive current flow indicated by the direction of the arrow. It is noted that the choice of direction for positive current flow is arbitrary, and does not limit the invention.

Figure 4C:
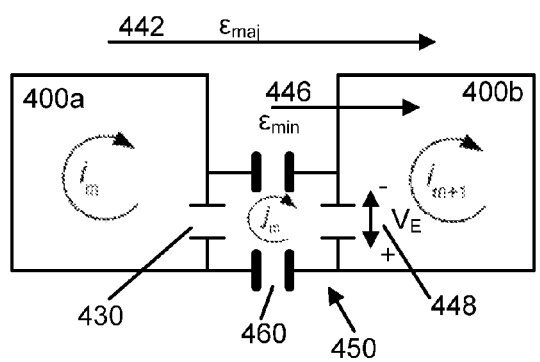
FIG. 4c shows a simplified version of the circuit model of FIG. 4b.

FIG. 4c shows a simplified version of FIG. 4b with inductors and resistors omitted for clarity. The net electromotive force (emf) induced in the m+1th major loop 400b by the current circulating in the mth major loop 400a and the mth minor loop 450 is given by:

$$V_{total} = \epsilon_M + V_E$$

where $\epsilon_M$ represents the total emf induced by magnetic coupling and $V_E$ is the voltage passed to the m+1th major loop 400b by its electrical coupling with the mth major loop 400a via the mth minor loop 450. This can be expressed as $$V_E = -j_M/(j\omega C)$$

where $j_M$ is the current flowing in the mth minor loop 450, $j=(-1)^{1/2}$ and C is the capacitance of the resonance capacitor 430.

$\epsilon_m$ may be represented as a combination of the effects of the magnetic coupling of the mth major loop 400 and the mth minor loop 450 on the m+1th resonant element.

$$\epsilon_M = \epsilon_{maj} + \epsilon_{min}$$

where $\epsilon_{maj}$ represents the emf induced in the m+1th major loop 400b by magnetic coupling with the mth major loop 400a, and can be expressed as $$\epsilon_{maj} = j\omega M_{maj} i_m.$$

Similarly, $\epsilon_{min}$ represents the emf induced in the m+1th major loop 400b by magnetic coupling with the mth minor loop 460, and can be expressed as $$\epsilon_{min} = j\omega M_{min} j_m.$$

In the present embodiment, the term $\epsilon_{maj}$ is negative. Due to Lenz's law a positive (clockwise) current in the first major loop 400a will induce a negative (anti-clockwise) current in the second major loop. The terms $\epsilon_{min}$ and $V_E$ are positive. Accordingly, there is competition between terms of opposite sign.

According to some embodiments the magnitude of the positive magnetic component $\epsilon_{min}$ may be smaller than magnitude of the negative magnetic component $\epsilon_{maj}$. In such embodiments the overall magnetic coupling is negative. In the arrangement of FIG. 4b the electric coupling $V_E$ is positive. Thus, in some embodiments the positive magnetic coupling between a major loop 400b and an adjacent minor loop 450 reinforces the positive electric coupling between the major loop 400b and a neighboring major loop 400a coupled via the minor loop 450. In some embodiments these positive components combined together may offset the negative component due to magnetic coupling between the two resonant elements 400a, 400b.

The overall coupling may be dominated by positive or negative coupling, leading to completely different dispersion relationships. A crossover between the two regimes (negative or positive dominant coupling) occurs when the positive and negative components are equal (i.e. cancel). With certain simplifying assumptions, this occurs when $$\left| j\left(\omega M_{min} J_m + \frac{j_m}{\omega C}\right) \right| = |j\omega M_{maj} i_m|.$$

Figure 5:
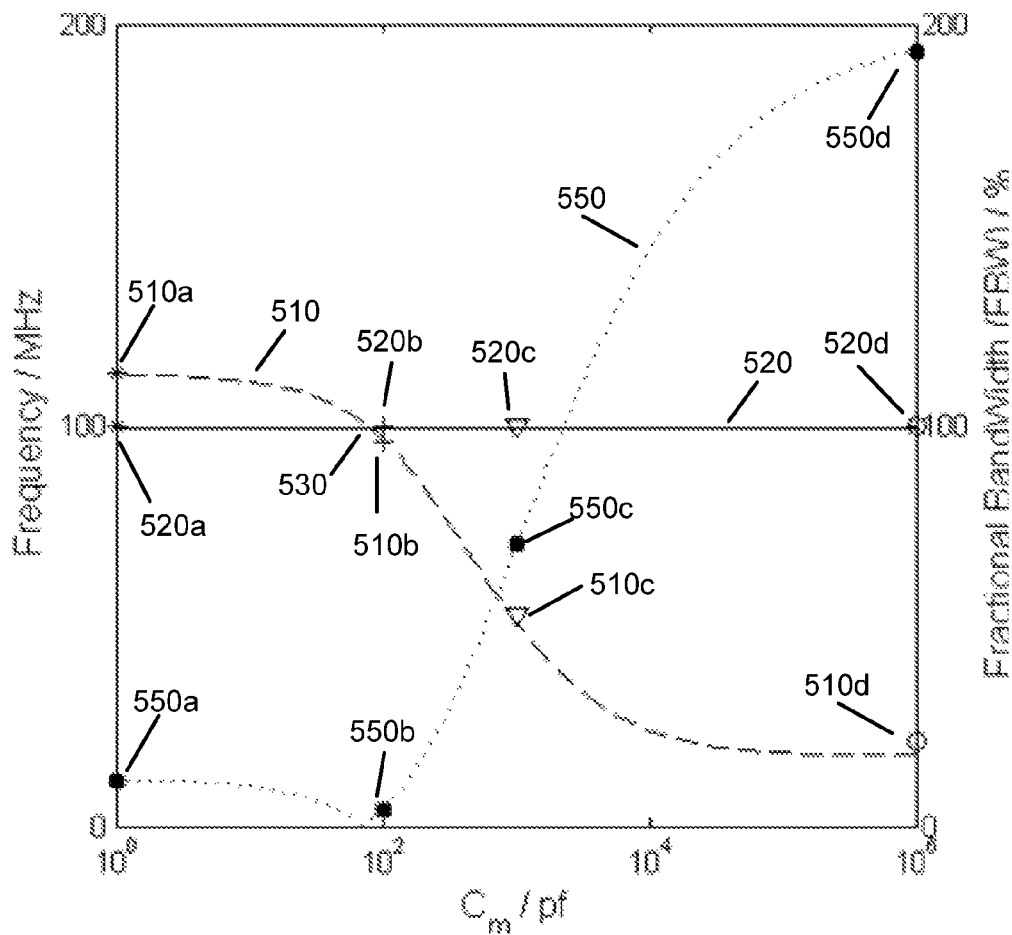
FIG. 5 shows pass band frequency bounds and fractional bandwidth as a function of the value of coupling capacitors in an exemplary one-dimensional embodiment.

FIG. 5 shows a comparison between theory and experimental measurements of embodiments according to the arrangement of FIG. 3. The experiments were carried out on four devices, each having ten major loops 300a-300c. Table 1 gives the dimensions of the metallic loops of the major loops, which were formed using a printed circuit board fabrication technique.

TABLE 1

| Dimension | Length (mm) |
| --- | --- |
| Inner-width 383 | 8.000 |
| Outer-width 380 | 9.500 |
| Track width | 0.750 |
| Gap width | 0.800 |
| Inter-element distance 385 | 0.900 |
| Copper layer thickness | 0.035 |

The values in table 1 result in the major loops having a self-inductance (4 L, with reference to FIGS. 4a-4c) of 20.32 nH. The values in table 1 also result in $M_{maj}=-1.19$ nH and $M_{min}=1.47$ nH. As noted above, $M_{maj}$ is negative, while $M_{min}$ is positive.

The magnetic coupling coefficient is a dimensionless measure of magnetic coupling strength given by $$k = \frac{2M}{L_{self}}$$

where M is the inter-element mutual inductance and $L_{self}$ is the element self-inductance. Thus $$k_{maj} = \frac{2M_{maj}}{L_{maj}} = -0.117 \text{ and } k_{min} = \frac{2M_{min}}{L_{min}} = 0.579.$$

220 pF capacitors were soldered across gaps in each major loop to provide the resonance capacitances 310. Pairs of capacitors 360 were soldered between pairs of neighboring major loops 300a-300c, as shown in FIG. 3, to form the minor loops 350a, 350b between the major loops.

As in FIG. 3, each of the resonance capacitors 310 (except at the ends of the waveguide) was located on a portion of the major loop that also formed part of the neighboring minor loop, such that the resonance capacitors 310 were shared between the major and minor loops.

The four different devices included one having no coupling capacitors, i.e. effectively having a coupling capacitance of 0F, and corresponding to the magnetoinductive waveguide of FIG. 1a. The remaining three devices had coupling capacitances of 100 pF, 1 nF and 1 µF, respectively.

FIG. 5 shows upper and lower standing wave frequency boundaries (pass band frequency bounds) associated with the resonance of the major loops as a function of the capacitance of the coupling capacitors, derived from measurements on the four devices that were fabricated, along with the predicted values from a theoretical model. Dashed line 510 shows the predicted frequency bound $$f_{L1} = \frac{\omega_{L1}}{2\pi},$$

given by $$\omega_{L1} = \sqrt{\frac{-b + \sqrt{b^2 - 4ac}}{2a}}.$$

Here:

$$a = -(3L^2 + 2LM_{maj} - 4M_{min}^2 + 4M_{min}L),$$

$$b = \frac{6L}{C} + \frac{8L}{C_m} + \frac{8M_{min}}{C} + \frac{4M_{maj}}{C} + \frac{4M_{maj}}{C_m}, \text{ and}$$

$$c = -\frac{4}{CC_m}.$$

$C_m$ is the capacitance of each of the coupling capacitors 360, and the self-inductance of the major loops is 4 L. This model is based on some simplifying assumptions, such as lossless propagation, such that R=0 and the attenuation constant a=0.

Points 510a-510d show the corresponding frequency bound $f_{L1}$ for the four experimental structures in order of increasing coupling capacitance.

Frequency bound $$f_{L2} = \frac{\omega_{L2}}{2\pi}$$

is given in the theoretical model by $$\omega_{L2} = \sqrt{\frac{1}{C(2L - M_{maj})}},$$

as shown by the solid line 520 in FIG. 5.

Points 520a-520d show the experimentally determined values of $f_{L2}$ in order of increasing coupling capacitance. This frequency bound corresponds to $$\frac{\beta d}{\pi} = \frac{2a}{N\lambda} = 0,$$

where β is the phase constant, d is the array period of the device (e.g. from the middle of one resonant element 300a to the middle of a neighboring resonant element 300b), a is the total length of the device, N is the number of major loops along the length of the device, and λ is the wavelength of a standing wave, where a is an integer multiple of λ/2.

$$\frac{\beta d}{\pi} = 0$$

is only achieved in theory when the number of resonant elements 300 in the device tends to infinity. In the experimental devices, the number of elements is limited to 10, and so the $f_{L2}$ frequency bound corresponds to $$\frac{\beta d}{\pi} = 0.1.$$

FIG. 5 shows that the theoretical model is a good approximation to the experimental devices. When the capacitance of each coupling capacitor, $C_m$, is 0, as shown by 510a and 520a, the device corresponds with the arrangement of FIG. 1a and the waves propagate as essentially pure magnetoinductive waves due to the negative magnetic coupling between neighboring resonant elements. As the coupling capacitance is increased the contributions of positive capacitive coupling, via the coupling capacitors, and the positive magnetic coupling between major and minor loops competes with the negative magnetic coupling, leading to a narrowing or shrinking of the pass-band. At $C_m=C_{ross}$ 530 the positive and negative contributions to the coupling cancel and there is no propagation in this band in the waveguide, as $f_{L1}=f_{L2}$ and the pass-band is reduced to zero. At this point, the device exhibits magnetic resonances without permitting end-to-end energy propagation in this pass-band. This may be useful in super lens imaging applications.

When $C_m > C_{cross}$ the positive contributions to the coupling exceed the negative contribution, and the pass-band becomes progressively wider as $C_m$ is increased.

The theoretical model gives $C_{cross}=70.155$ pF in the example of FIG. 5. This is calculated using the formula:

$$C_{cross} = \frac{(-8C)(4k_{maj} - 4k_{maj}^2)}{9 + 6k_{min} - 8k_{min}k_{maj} + k_{min}^2 - 16k_{maj}^2}$$

This is derived by equating $\omega_{L1}$ and $\omega_{L2}$ and substituting kmaj and kmin, as given above. This equitation assumes that the self-inductances of the major and minor loops ($L_{maj}$ and $L_{min}$) are 4 L and L, respectively.

In the region $C_m < C_{cross}$, $f_{L1} > f_{L2}$ and so the waveguide supports backward propagation of waves. When $C_m > C_{cross}$, $f_{L1} < f_{L2}$ and so the waveguide supports forward propagation of waves. The experimental device with no coupling capacitors ($C_m=0$, $C_m<C_{cross}$), corresponding to points 510a and 520a, such that negative coupling dominates and $f_{L1} > f_{L2}$. Accordingly, this device supports backward propagation of waves. The remaining three experimental devices, shown by points 510b-510d and 520b-520d have $C_m > C_{cross}$, and so positive coupling dominates, $f_{L1} < f_{L2}$ and forward propagation of waves is supported in each of these devices.

Dotted line 550 shows the fractional bandwidth corresponding to the frequency bounds $f_{L1}$ and $f_{L2}$ in FIG. 5. Fractional bandwidth (FBVV) is defined as the ratio of the total bandwidth to the centre frequency, $$FBW = \frac{2|f_{L1} - f_{L2}|}{f_{L1} + f_{L2}},$$

The device having no coupling capacitors, corresponding to the arrangement of FIG. 1a, is represented by point 550a and has an FBW of 9.52%.

Of the four experimental devices, the one having $C_m=100$ pF, corresponding to point 550b in FIG. 5, has the narrowest pass-band. In this case $C_m$ is close to the non-propagation condition $C_m=C_{cross}=70.155$ pF. The FBW in this device is 4.08% indicating that the cancelling effect between positive and negative coupling is close at this value of $C_m$.

The largest pass-band FBW achieved in the experimental devices is 193.5%, when $C_m=1$ μF. This FBW greatly exceeds the minimum requirement for description as an ultra-wideband channel, and closely approximates the 200% limit of an ultra-wideband channel. The FBW can be increased further, beyond 193.5% by using larger values of $C_m$. For $C_m$ greater than 1 μF, the pass-band approaches 200% asymptotically.

The FBW that may be achieved by the embodiment of FIG. 3, as exemplified in relation to the examples of FIG. 5, may demonstrate significant improvement in bandwidth in comparison with the arrangement of FIG. 1a. The in a flat one-dimensional array according to the arrangement of FIG. 2, the theoretical maximum FBW is 40%. This maximum is not practically achievable, as, for example, conductors of zero width would be required. The best practical device known to the inventors has an FBW of around 25%. Thus, the embodiment of FIG. 3 can produce significant improvement in bandwidth over the arrangement of FIG. 2.

The bandwidth of the arrangement of FIG. 1a is limited by the geometry of the arrangement: the coupling between nearest neighbors depends on the magnetic flux of one resonant element that passes through the loop of the neighbouring resonant element, and so the minimum achievable inter-element separation that can be achieved in the production process of the device places an upper limit on the practically achievable bandwidth.

In the some embodiments according to the arrangement of FIG. 3, the coupling includes significant capacitive coupling between neighboring resonant elements. Capacitive coupling be readily adjusted by changing the capacitances of the coupling capacitors. The capacitive coupling allows an increase in coupling strength, allowing an increase in bandwidth to be achieved in some embodiments. The increased coupling in the embodiment of FIG. 3 may also lead to improved loss performance of the waveguide relative to the arrangement of FIG. 1a.

The above description of the pass-band of the embodiment of FIG. 3 relates to a first pass-band associated with the resonance of the major loops 300a-c.

The second pass-band, associated with the resonance of the minor loops 350 will generally have a different dependence on the coupling capacitance $C_m$, and the second pass-band may permit propagation of waves when the first pass-band is zero, i.e. when $C_m=C_{cross}$. In some examples, the second pass-band may have a crossing point at a different value of $C_m$ compared with the first pass-band, or might not have a crossing point at all, depending on the structural parameters of the waveguide.

The frequency bounds of the second pass-band can be estimated in a similar manner to the first pass-band, giving $$\omega_{H1} = \sqrt{\frac{-b + \sqrt{b^2 - 4ac}}{2a}} \text{ and } \omega_{H2} = \sqrt{\frac{2}{CL} + \frac{2}{C_mL}},$$

where a, b and c are as given above in relation to $\omega_{L1}$ and $\omega_{L2}$.

Figure 6:
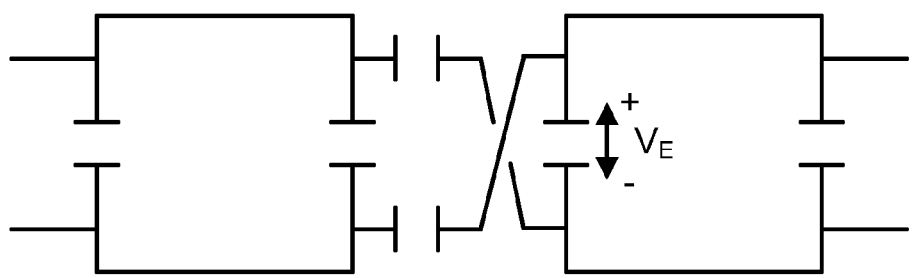
FIG. 6 illustrates an alternative embodiment.

FIG. 6 shows another embodiment having major and minor loops, similar to the arrangement of FIG. 3. However, the minor loops of FIG. 6 have a crossover configuration, with a 180 degree twist about an axis connecting the shared portions of the minor loop, resulting in the unshared sides of the coupling section crossing. The pair of coupling capacitors may be connected to the first and second major loops at four connection points (one point for each capacitor/major loop pairing). According to the arrangement of FIG. 6, a continuous one-way circuit (e.g. in a clockwise direction) visiting each of the connection points in turn will alternate between connection points of the first coupling capacitor and connection points of the second coupling capacitor. In contrast, such a circuit in the embodiment of FIG. 3 would encounter at least two consecutive connection points associated with the same capacitor. This arrangement may be constructed, for example, buy producing the major loops as traces on a PCB and connecting one coupling capacitor on a first side of the board and the second coupling capacitor in the second, reverse side of the board, for example. This arrangement could also be produced by positioning the capacitors one above the other in a direction perpendicular to the plane of the PCB. Other possibilities are also possible.

In the arrangement of FIG. 6, the sign on the voltage passed on to the second resonant element $V_E$ is reversed relative to the embodiments shown in FIGS. 3, 4b and 4c. Thus, the capacitive coupling on FIG. 6 is negative, and reinforces $\epsilon_{maj}$. This is expected to provide a wider bandwidth than an equivalent arrangement according to FIG. 3, in embodiments with $\epsilon_{maj} > \epsilon_{min}$, since the negative capacitive coupling of FIG. 6 reinforces the negative magnetic coupling $\epsilon_{maj}$. In such embodiments, $f_{L1} > f_{L2}$ for all coupling capacitances, and there would not be no coupling capacitance at which $f_{L1} = f_{L2}$. This arrangement would support backward propagation of waves. The arrangement of FIG. 3 may be less complicated and/or cheaper to produce than the arrangement of FIG. 6 for some fabrication technologies.

As with FIG. 3, FIG. 6 would also have a second pass band associated with the resonance of the coupling sections.

Figure 7:
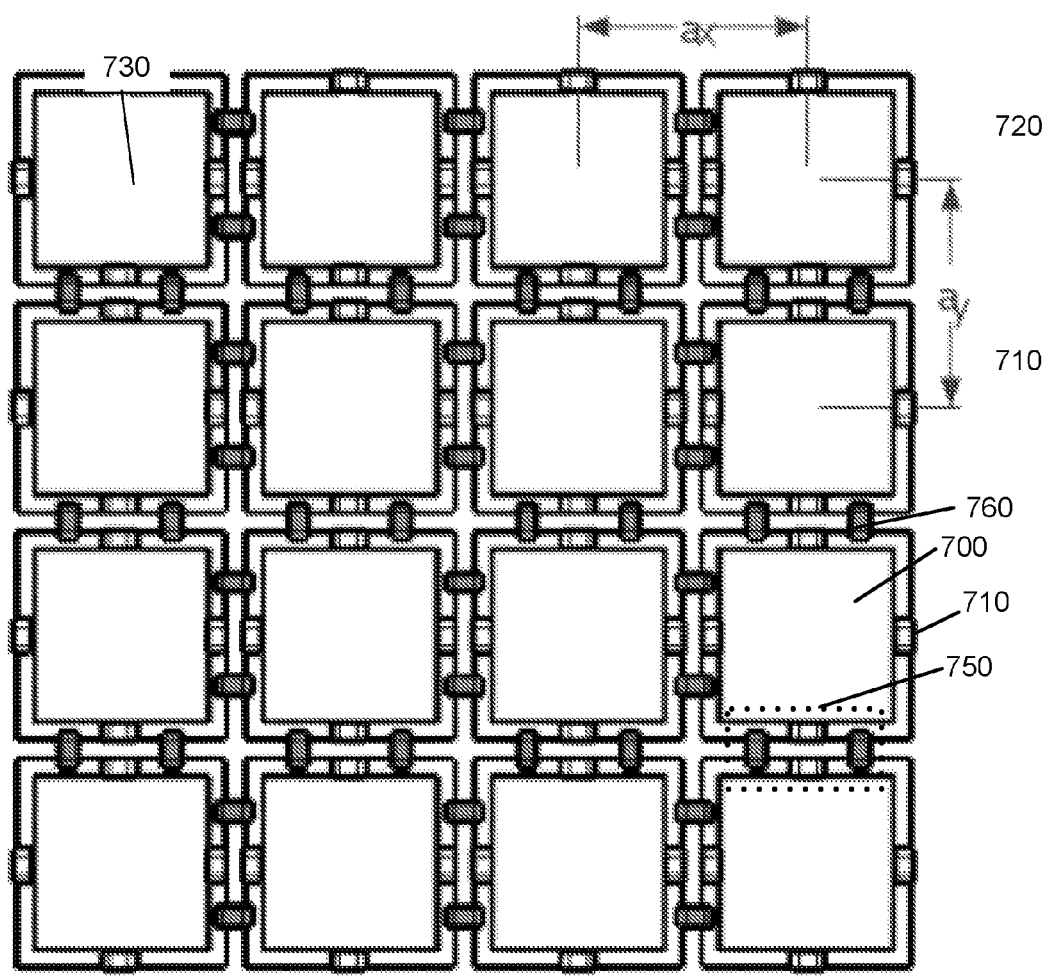
FIG. 7 shows an embodiment of a two-dimensional waveguide having resonant elements and coupling sections.

FIG. 7 shows 2-D waveguide surface that offers a multi-terminal, multipath environment for ultra-wideband data transfer channels. This embodiment has a two-dimensional array of resonant elements 700, with each pair of neighboring resonant elements 700 coupled by a coupling section 750. As with FIG. 3, the arrangement of FIG. 7 has a periodic structure with two different types of element in each period. However, in the example of FIG. 7 there is one resonant element 700 and two coupling sections 750 in each period.

As in the embodiment of FIG. 3, each resonant element 700 includes at least one resonance capacitor 710. In the embodiment of FIG. 7, each resonant element 700 has four resonance capacitors 710, which are shown unshaded. Each coupling section 750 has at least one coupling capacitor 760. Coupling capacitors are shown shaded in FIG. 7. In the Embodiment of FIG. 7, each coupling section 750 is formed by a pair of coupling capacitors 760 connected to and between pairs of resonance elements 700, such that for each of the pair of resonance elements 700 the coupling capacitors 760 are connected on respective sides of a resonance capacitor 710. Accordingly, as with FIG. 3, a portion of each resonant element 700 is shared with a neighboring coupling section 750, the shared portion including a resonance capacitor 760. In the arrangement of FIG. 7, each coupling section includes two coupling capacitors 760 and two resonance capacitors 710, with one resonance capacitor 710 shared with each of the pair of resonant elements 700.

In some embodiments, the resonant elements 700 may be considered to be major loops, and the coupling sections 750 may be considered to be minor loops. The waveguide surface in FIG. 7 may be produced and characterized in a similar way to the one-dimensional arrangements of FIGS. 3, 4b and 4c. For example, as a continuous mesh of alternating major loops and minor loops, but in two different directions (e.g. horizontally and vertically), denoted herein as the x and y directions. As shown in FIG. 7, the array period along the $\hat{x}$ and $\hat{y}$ directions are $a_x$ and $a_y$, respectively, where $\hat{x}$ and $\hat{y}$ are normalized basis vectors for the array. In the embodiment of FIG. 7, $\hat{x}$ and $\hat{y}$ are parallel to sides of the squares forming the major m loops. The array period is the repeat period of the structure, e.g. the distance between centers of neighboring major loops. In the example of FIG. 7, $a_x = a_y$, and the $\hat{x}$ and $\hat{y}$ directions are orthogonal.

In some embodiments the directions define a plane corresponding to the waveguide surface. The directions may be non-orthogonal in some embodiments, e.g. when the major loops are rhombohedral in shape.

Figure 8:
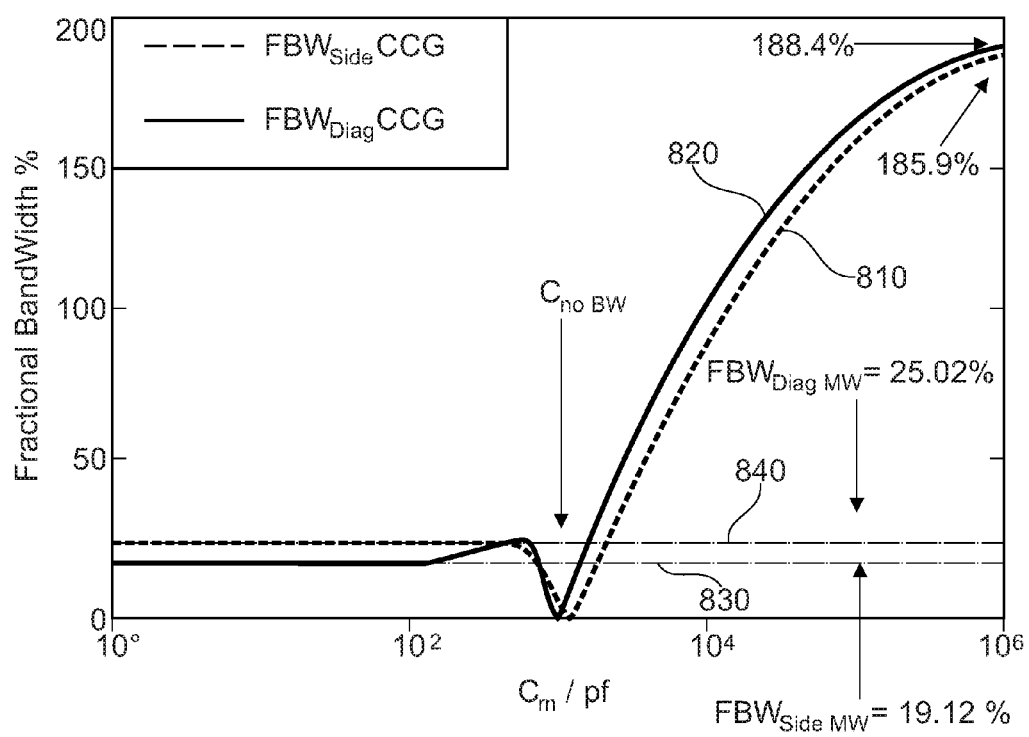
FIG. 8 shows fractional bandwidth as a function of the value of coupling capacitors in an exemplary two-dimensional embodiment.

FIG. 8 shows the result of applying a theoretical model based on the circuit approximation in the absence of retardation, similar to the model in the 1-D case. Couplings between major loops to first-nearest neighbors and diagonal neighbors are considered. The structural dimensions are as used in the 1-D case, and given in Table 1, above. The structure-dependent magnetic coupling related factors, L, $M_{maj}$, and $M_{min}$ have the same values as in the 1-D example above. In addition, $M_{diag}$ describes the mutual inductance a major loop and a next major loop along a diagonal direction i.e. along $(\hat{x} + \hat{y})/\sqrt{2}$.

FIG. 8 shows the FBW corresponding to wave propagation in two special cases: (1) the wave only propagates along the diagonal ($k_x a_x = k_y a_y$); and (2) the wave only propagates along the side in with the $\hat{x}$ or $\hat{y}$ direction ($k_x a_x = 0$ or $k_y a_y = 0$). FIG. 8 shows change in the FBW in these two cases with changing capacitive coupling strength, with $C_m$ varying between 1 pF to 1 µF. Line 810 shows the FBW for waves propagating along the $\hat{x}$ or $\hat{y}$ directions, and line 820 shows the FBW for waves propagating along the diagonal direction. For comparison, the FBW is shown for an equivalent 2-D pure magnetoinductive wave device, having the same structure, but omitting the coupling capacitors ($C_m = 0$). Line 830 shows the FBW for waves propagating along the $\hat{x}$ or $\hat{y}$ directions, and line 840 shows the FBW for waves propagating along the diagonal direction. As the pure magnetoinductive wave device does not include coupling capacitors, lines 830 and 840 are constant with changing $C_m$.

As with the 1-D structure of FIG. 3, the arrangement of FIG. 7 demonstrates a $C_m$ value at which the positive and negative contributions to the coupling cancel out, and no propagation occurs along a particular direction. This occurs at $C_m = C_{cross\ diag} = 884.6$ pF for wave propagation along the diagonal direction. This occurs at $C_m = C_{cross\ x} = C_{cross\ y} = 1037$ pF for wave propagation along either of the $\hat{x}$ or $\hat{y}$ directions. $C_{cross}$ is used herein to refer generally to any one of $C_{cross\ diag}$, $C_{cross\ x}$, or $C_{cross\ y}$. FIG. 8 shows the approximate region of $C_{cross\ diag}$, $C_{crossx}$ and $C_{cross\ y}$ by $C_{no\ BW}$.

In the region $C_m > C_{cross}$, the pass band becomes progressively wider as $C_m$ is increased. For Cm=1 µF, with the transmit resonator above the centre cell, the fractional bandwidth reaches 185.9% along the $\hat{x}$ and $\hat{y}$ directions, and 188.4% along the diagonal. This exceeds the requirement to be considered an ultra-wideband channel. The fractional bandwidth for the equivalent pure magnetoinductive device is 19.12% along the sides and 25.02% along the diagonal. Thus, embodiments according to the arrangement of FIG. 7 may provide significant improvement in bandwidth over pure magnetoinductive wave devices.

When the transmit resonator is placed above a corner cell in the arrangement of FIG. 7, with Cm=1 µF, the fractional bandwidth along the diagonal direction is again 188.4%, and the fractional bandwidth along the $\hat{x}$ and $\hat{y}$ directions narrows to 27%.

Figure 9A:
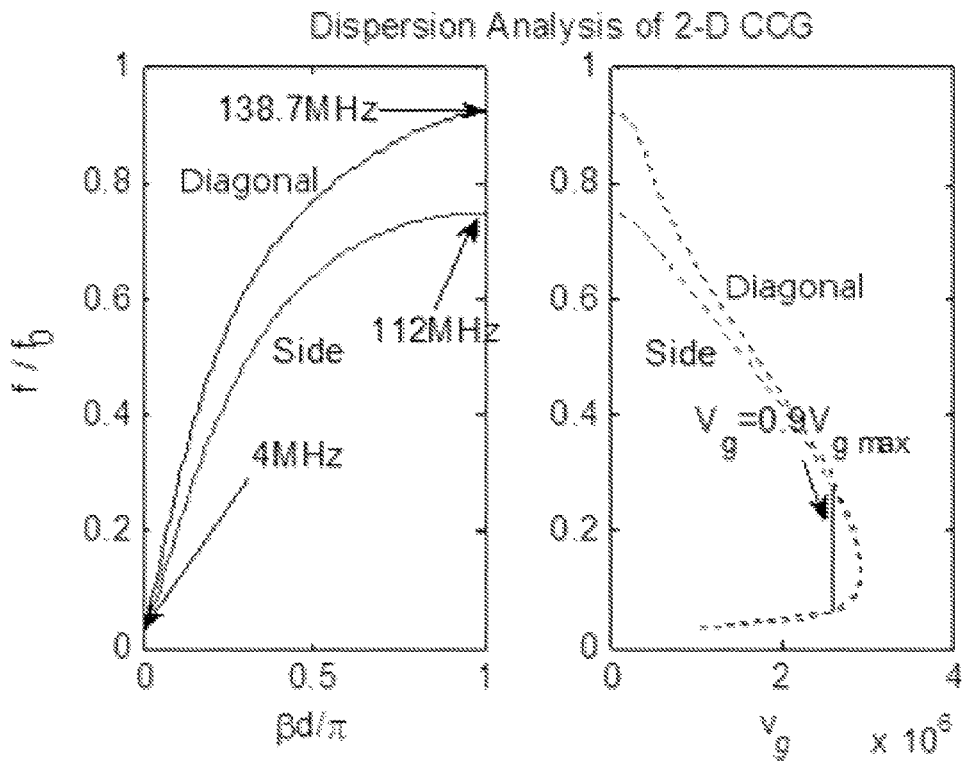
FIG. 9a shows phase constant and group velocity for an exemplary two-dimensional embodiment.
Figure 9B:
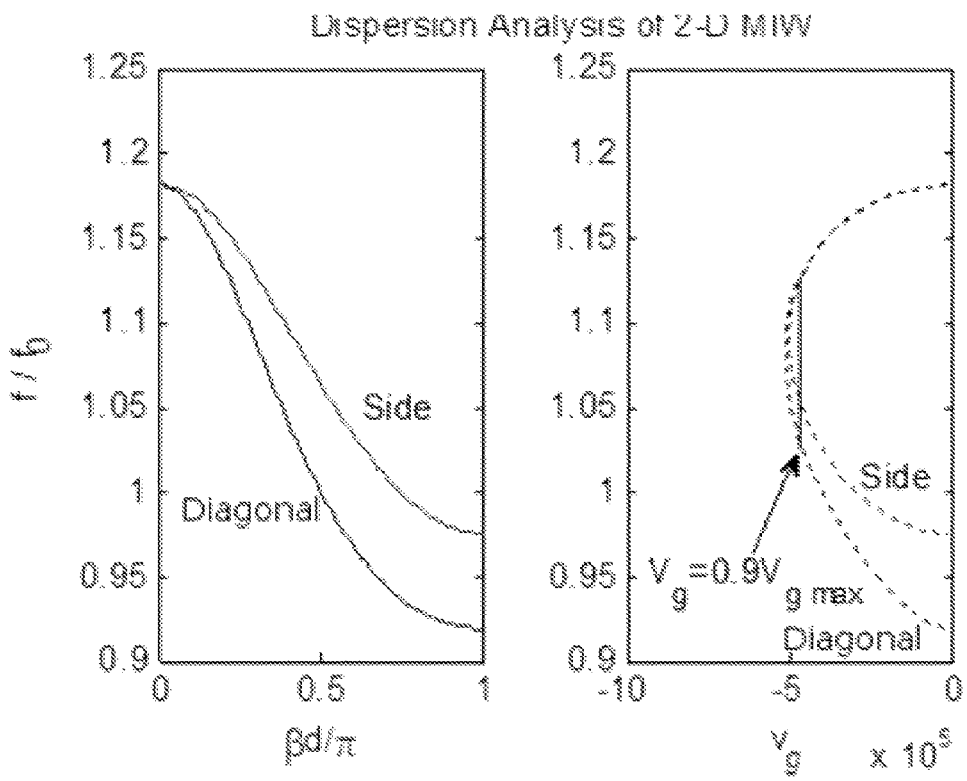
FIG. 9b shows phase constant and group velocity for an arrangement according to FIG. 1.

The effects of dispersion on modulated signals is a consideration for determining suitability of a channel as a data transfer channel. FIG. 9a shows a dispersion analysis for the device of FIG. 7 with the same parameters as used for FIG. 8, and taking $C_m = 1$ µF. FIG. 9b shows a dispersion analysis for a corresponding purely magnetically coupled device ($C_m = 0$). This shows that, for the $C_m = 1$ µF device, a less dispersive characteristic where $v_g$ is slowly varying, is achieved at the lower frequencies of the pass band. By comparing this device with a pure magnetoinductive device at a threshold value of $V_9 = 0.9 v_{g\ max}$, where $v_{g\ max}$ is the respective peak group velocity achieved over the whole of the respective pass bands, the device with $C_m = 1$ µF covers around 0.2 $f_0$ (in this case 30 MHz) more than the device with $C_m = 0$. This shows that the $C_m = 1$ µF device provides a low dispersion over a greater frequency range than the $C_m = 0$ device, and so provides a good data transfer channel.

In some embodiments of a 2-D device, the coupling sections 750 may have crossed capacitors, by analogy with the 1-D arrangement of FIG. 6. As with the embodiment of FIG. 6, in these 2-D arrangements the capacitive coupling would be negative and reinforce the coupling due to the negative $M_{maj}$ term.

Figure 10:
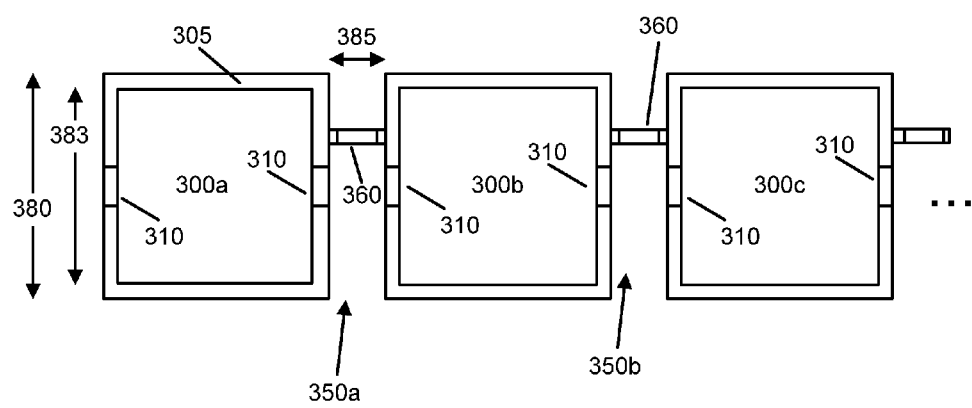
FIG. 10 shows a further one-dimensional embodiment.

In the embodiments described herein, the coupling section included two coupling capacitors, but other arrangements for the coupling section are possible. For example, the coupling section may have only a single coupling capacitor, as shown in FIG. 10.

In some embodiments, each of the resonant elements have a first resonant frequency. The coupling sections are also resonant circuits having a second resonant frequency, although for consistency of terminology, the coupling sections are not referred to herein as "resonant elements". According to some embodiments the first and second resonant frequencies may be different.

In some embodiments, the coupling section may have the same resonant frequency as the resonant elements (e.g. major loops), this may result in the pass-band associated with the coupling section being close to the pass-band associated with the resonance of the resonant elements. Where the coupling sections have a different resonant frequency from the resonant elements, the pass-bands associated with the coupling section and resonant elements are likely to be separated, reducing the likelihood of attenuation between the pass-bands reducing the performance of the device as a waveguide.

Regardless of whether the resonant frequency of the coupling sections are the same or different from the resonant frequency of the resonant elements, the waveguide will have two different pass-bands: the first pass band, associated with the resonance of the major loops, and the second pass-band associated with the resonance of the minor loops. These pass-bands may overlap in frequency, but will have different properties, and will, at most, only partially overlap: the first and second pass-bands will not coincide with each other. The arrangements of FIGS. 1 and 2 do not have two different types of resonators, and do not have a second pass-band.

In some embodiments the second pass-band is at a higher frequency than the first pass-band.

Some embodiments may be produced by connecting the coupling capacitors over inter-element gaps between capacitively-loaded metallic loops to produce a continuous circuit mesh of alternating major and minor loops.

According to some embodiments, the capacitive coupling between the resonant elements dominates the overall magnetic coupling (associated with $\epsilon_{maj}$ and $\epsilon_{min}$, e.g. $|\epsilon_{maj}+\epsilon_{min}|$, where $\epsilon_{maj}$ and $\epsilon_{min}$ have opposite signs in the example of FIG. 3). According to some embodiments, the capacitive coupling between the resonant elements dominates the direct magnetic coupling between the resonant elements (i.e. the magnetic coupling associated with $\epsilon_{maj}$). For example, in the embodiment of FIG. 4c, $V_E$ has a larger absolute value than $\epsilon_{maj}$. According to some embodiments, the capacitive coupling between the resonant elements dominates the all of the magnetic coupling components between the resonant elements. For example, in the embodiment of FIG. 4c, $V_E$ has a larger absolute value than $|\epsilon_{maj}|+|\epsilon_{min}|$.

The examples herein have square resonant elements, but embodiments may have resonant elements of other shapes. Square resonant elements provide simplicity for analysis and allow for good inter-element coupling. Square elements tessellate, providing a simple tiling of a 2D surface.

Some examples and embodiments herein have been illustrated with two or three resonant elements for simplicity and clarity. It is to be understood that many resonant elements could be used in order to increase the length or area of the waveguide. The number of resonant elements is not particularly limited.

According to some embodiments the resonant elements may be formed of a polygonal conductive loop with a resonance capacitor on each side of the polygon.

According to some embodiments each coupling section includes first and second coupling capacitors, wherein the first and second coupling capacitors are connected to the first resonant element at different sides of a resonance capacitor of the first resonance element, and the first and second coupling capacitors are connected to the second resonant element at different sides of a resonance capacitor of the second resonant element.

Theoretical models have been given to explain the operation of embodiments of the invention. However, the invention is not limited to a particular theory or model of operation. It is to be understood that approximations and simplifying assumptions may have been made in deriving the models of the devices, and do not necessarily reflect actual devices in every detail, and actual devices may deviate from the ideal cases used to illustrate the operation and theory.

Another aspect provides a lens for super lens imaging. In particular, when the magnetic and capacitive interactions cancel (e.g. when $C_m=C_{cross}$ in the examples of FIGS. 5 and 8) waves do not propagate within the device (at least within the first pass-band). This is a desirable property for a superlens. A magnetic superlens is a device for transferring magnetic flux at a sub-wavelength scale from one place to another whilst preserving the spatial structure. Metamaterials that exhibit their own propagating waves cannot operate as superlenses at these frequencies because energy would be spread throughout the structure by the waves, destroying any spatial arrangement they may have had. A system having a strong magnetic permeability, and in which waves do not propagate, may produce a good superlens.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A system for carrying waves by inductive coupling, the system comprising:
 a metamaterial waveguide, the metamaterial waveguide comprising a plurality of resonant elements, the plurality of resonant elements including:
  a first resonant element;
  a second resonant element; and
  a coupling section capacitively coupling the first and second resonant elements, wherein
  the coupling between the first and second elements produces a first pass-band and a second-pass band, different from the first pass-band,
  the first pass-band being associated with the resonance of the resonant elements and the second pass-band being associated with resonance of the coupling section.

2. The system of claim 1, wherein
 the first resonant element forms a first major loop and the second resonant element forms a second major loop, and
 the coupling section forms a minor loop such that respective portions of each of the first and second major loops is shared with the minor loop.

3. The system of claim 2, wherein each of the shared portions includes a capacitor.

4. The system of claim 1, wherein the waves are forward propagating.

5. The system of claim 1, wherein an electrical contribution to the coupling between the first and second resonant elements dominates a magnetic contribution to the coupling between the first and second resonant elements.

6. The system of claim 1, wherein:
 the first resonant element has the same frequency as the second resonant element, and
 the coupling section resonates with a resonant frequency different from the resonant frequency of the first and second resonant element.

7. The system of claim 1, wherein the coupling section comprises one or more coupling capacitors connected between the first and second resonant elements.

8. The system of claim 1, comprising a one-dimensional array of coupling sections, each consecutive pair of resonant elements having a respective coupling element capacitively coupling the pair of resonant elements.

9. The system of claim 1, comprising a two-dimensional array of coupling sections, each pair of neighbouring resonant elements having a respective coupling element capacitively coupling the pair of resonant elements.

10. A system comprising:
 the system of claim 1; and
 a communication unit, wherein
 the communication unit comprises:
 an IO resonant element that is arranged to transmit and/or receive a signal to/from the first resonant element by inductively coupling to the first resonant element, and
 a signal source and/or destination conductively connected to the IO resonant element.

11. A method of transporting a signal in a metamaterial waveguide by inductive coupling, the method comprising:
 receiving the signal at a first resonant element or a coupling section; and propagating the signal to a second resonant element, wherein
 the first and second resonant elements are capacitively coupled by the coupling section,
 the coupling between the first and second elements produces a first pass-band and a second-pass band, different from the first pass-band,
 the first pass-band being associated with the resonance of the resonant elements and the second pass-band being associated with resonance of the coupling section, and
 the first and second resonant elements and the coupling section form at least part of the metamaterial waveguide for propagating the signal by inductive coupling.

12. The method of claim 11, wherein the signal is received by the first resonant element or the coupling section from an element external to the metamaterial waveguide.

13. The method of claim 11, wherein the signal is received by the first resonant element or the coupling section from a further resonant element or further coupling section of the metamaterial waveguide.

* * * * *